United States Patent
Ho et al.

(10) Patent No.: US 8,487,397 B2
(45) Date of Patent: Jul. 16, 2013

(54) METHOD FOR FORMING SELF-ALIGNED CONTACT

(75) Inventors: Jar-Ming Ho, Taoyuan County (TW); Yi-Nan Chen, Taoyuan County (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 181 days.

(21) Appl. No.: 13/093,742

(22) Filed: Apr. 25, 2011

(65) Prior Publication Data

US 2012/0267727 A1  Oct. 25, 2012

(51) Int. Cl.
*H01L 23/52* (2006.01)

(52) U.S. Cl.
USPC .... 257/503; 257/401; 257/448; 257/E21.507; 438/303; 438/533; 438/587; 438/595

(58) Field of Classification Search
None
See application file for complete search history.

(56) References Cited

U.S. PATENT DOCUMENTS

| | | | |
|---|---|---|---|
| 6,194,302 B1* | 2/2001 | Shen | 438/597 |
| 2002/0001970 A1* | 1/2002 | Becker | 438/761 |

* cited by examiner

*Primary Examiner* — Tan N Tran
*Assistant Examiner* — Scott R Wilson

(57) ABSTRACT

An integrated circuit with a self-aligned contact includes a substrate with a transistor formed thereover, a dielectric spacer, a protection barrier, and a conductive layer. The transistor includes a mask layer and a pair of insulating spacers formed on opposite sides of the mask layer. The dielectric spacer partially covers at least one of the insulating spacers of the transistor. The protection barrier is formed over the dielectric spacer. The conductive layer is formed over the mask layer, the protection barrier, the dielectric spacer, the insulating spacer and the dielectric spacer as a self-aligned contact for contacting a source/drain region of the transistor.

13 Claims, 4 Drawing Sheets

METHOD FOR FORMING SELF-ALIGNED CONTACT

BACKGROUND OF THE INVENTION

1. Field of the Invention

The invention relates to semiconductor fabrication, and more particularly to a method of forming a self-aligned contact.

2. Description of the Related Art

Forming reliable contact structures for semiconductor devices have become more difficult as feature sizes have decreased and device densities on a chip have increased. For example, the aspect ratio (ratio of depth to width) of contact structures increases as device density increases. As a result, it is becoming increasingly difficult to perform contact etching to a required depth without over-etching in a lateral direction.

In order to more reliably fabricate smaller semiconductor device structures at higher density, self-aligned contacts may be used. Self-aligned contacts improve not only the physical characteristics of a contact, but the electrical characteristics as well. Self-aligned contacts use material properties of structures themselves to prevent or reduce the occurrence of some process errors, such as those described above.

One conventional method of forming a self-aligned contact includes first providing a substrate on which there are at least two MOS devices and then forming an insulating layer, such as silicon oxide, on the two MOS devices. Each of the two MOS devices includes a conductive gate and spacers on the sidewalls of the gate. The two MOS devices have a common source/drain region located between the gates of the two MOS devices. The insulating layer is patterned to form a self-aligned contact opening to expose the common source/drain region. A conductive layer is deposited in the self-aligned contact opening to form a self-align-contact.

However, as feature sizes of the MOS devices decrease, a pitch between adjacent MOS devices also decreases to increase device density, such that spacers of the MOS devices exposed by the self-aligned contact opening may be partially removed during formation thereof and the conductive gate may then be exposed. Exposure of the conductive gates after of the contact opening is undesired since shorts will happen between the conductive gate and the self-aligned contact after formation of the conductive layer in the contact opening.

BRIEF SUMMARY OF THE INVENTION

Therefore, a method for forming a self-aligned contact and an integrated circuit with a self-aligned contact for addressing the above drawbacks are provided.

In one embodiment, an exemplary method for fabricating a self-aligned contact comprises providing a substrate with a transistor thereover, wherein the transistor comprises a mask layer and a pair of insulating spacers formed on opposite sides of the mask layer. A dielectric layer is formed over the substrate to cover the transistor. The dielectric layer is partially removed to expose a top portion of the transistor. A barrier layer is conformally formed over the dielectric layer and the top portion of the transistor. The barrier layer is etched and a protection barrier is left over a top corner of the insulating spacers of the transistor. An etching process is performed to entirely remove the dielectric layer using the protection barrier and the mask layer as an etching mask, thereby forming a self-aligned contact opening exposing a source/drain region of the transistor and a dielectric spacer covered by the protection barrier. A conductive layer is formed in the self-aligned contact opening to contact the source/drain region of the transistor.

In another embodiment, an exemplary integrated circuit with a self-aligned contact comprising a substrate with a transistor formed thereover, a dielectric spacer, a protection barrier, and a conductive layer. The transistor comprises a mask layer and a pair of insulating spacers formed on opposite sides of the mask layer. The dielectric spacer partially covers at least one of the insulating spacers of the transistor. The protection barrier is formed over the dielectric spacer. The conductive layer is formed over the mask layer, the protection barrier, the dielectric spacer, the insulating spacer and the dielectric spacer as a self-aligned contact for contacting a source/drain region of the transistor.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1-6 are cross sections showing an exemplary method for forming a self-aligned contact.

Figure 1:
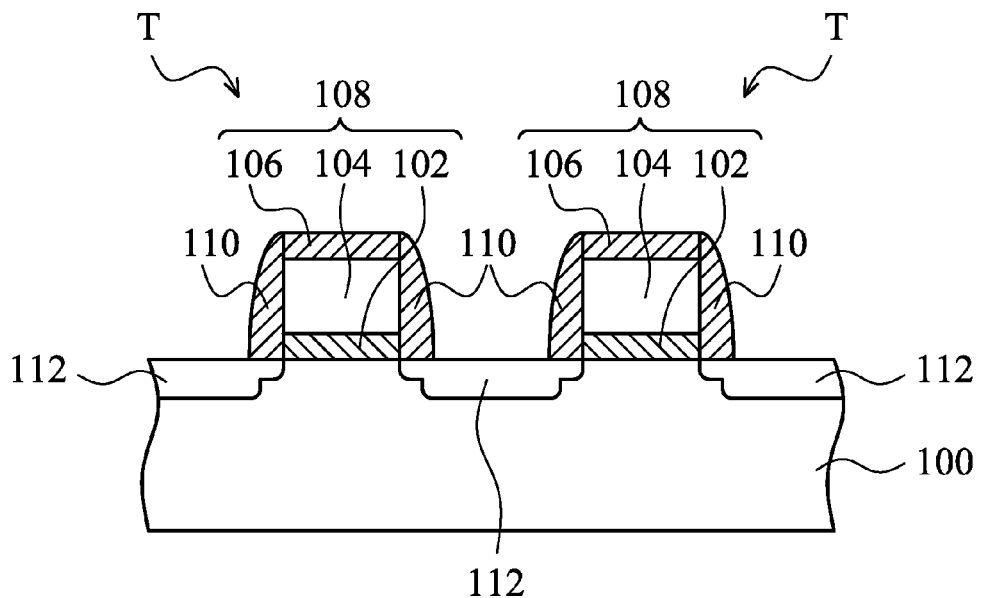
FIGS. 1-6 are cross sections showing a method for forming a self-aligned contact according to an embodiment of the invention.

In FIG. 1, a substrate 100 with two transistors T formed thereover is provided. The substrate 100 can be, for example, a P-type semiconductor substrate, and each of the transistors T comprises a gate structure 108 formed on the semiconductor substrate 100 and a pair of source/drain region 112 formed in the substrate 100 adjacent to opposite sides of each of the transistors T. In this embodiment, the two transistors T share a common source/drain region 112 and the source/drain region can be, for example, an n-type doped region formed in the substrate 100. The gate structure 108 of the transistors T comprises a gate dielectric layer 102, a gate electrode 104, and a mask layer 106 sequentially formed over the substrate 100, and a pair of insulating spacers 110 are formed on opposite sidewalls of the gate structure 108. The gate dielectric layer 102 can be, for example, a silicon oxide layer. The gate electrode 104 may comprise materials of doped polysilicon, metal or composite thereof. The mask layer 106 may comprise materials such as silicon nitride and the insulating spacers 110 may comprise materials such as silicon nitride.

Figure 2:
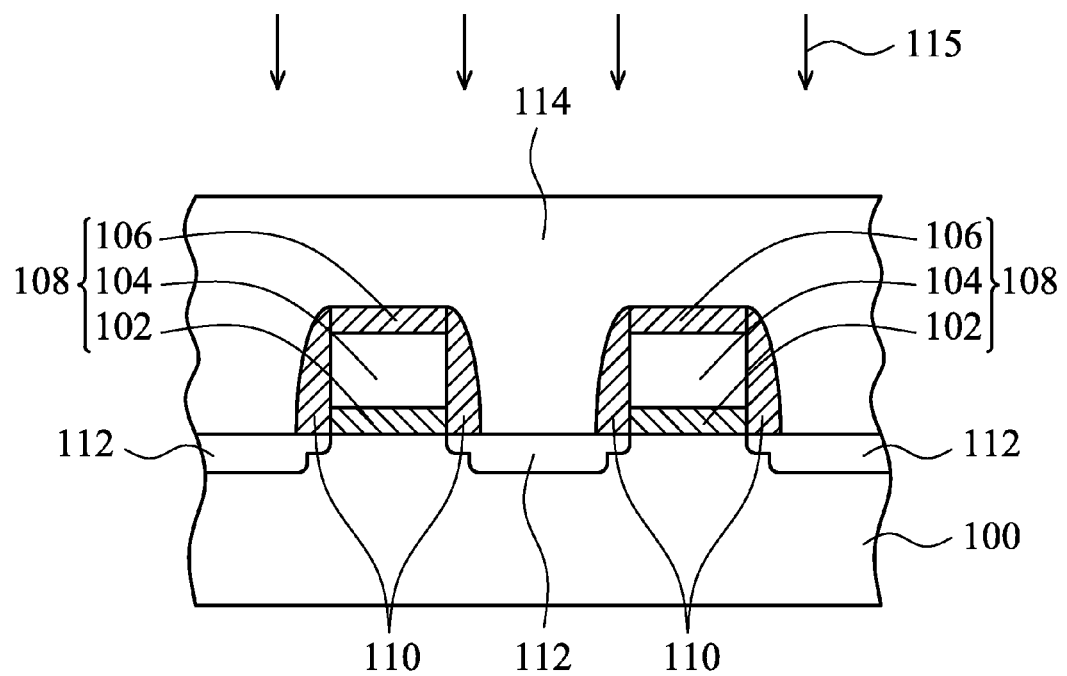

In FIG. 2, a dielectric layer 114 is then blanketly formed over the substrate 100 to cover the transistors T. The dielectric layer 114 may comprise materials such as $SiO_2$ formed by tetraethyl orthosilicate (TEOS), boron phosphorous silicon glass (BPSG) or spin-on dielectrics (SOD), and thus can be formed by, for example, a chemical vapor deposition (CVD) or a spin-on method. Thus, the dielectric layer 114 is formed with a planar top surface. Next, an etching process 115, for example a dry etching process, is performed to the dielectric layer 114 to remove a portion thereof until a top portion of the transistors T are partially exposed, as shown in FIG. 3.

Figure 3:
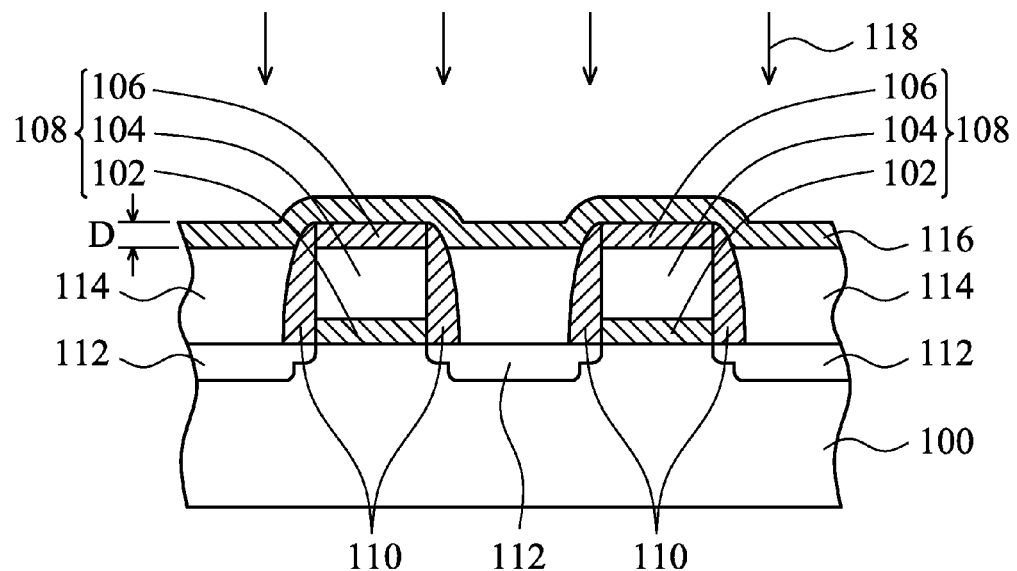

In FIG. 3, a thickness of the dielectric layer 114 is reduced and a distance D of the top surface of the dielectric layer 114 to a top surface of the gate structure 108 of the transistors T is about 2-15 nm. Next, a barrier layer 116 is conformably formed over the dielectric layer 114 and the exposed surfaces of the transistors T, covering the exposed portions of the insulating spacers 110 and the mask layer 106. The barrier layer 116 is formed of materials such as silicon nitride (SiN) or silicon oxynitride (SiON) and has a thickness of about 2-10 nm, and the distance D is not less than the thickness of the barrier layer 116. Next, an etching process 118, for example a dry etching process, is performed to etch back the barrier layer 116, thereby forming a protection barrier 116a adjacent to a top corner of each of the insulating spacers 110 and again exposing most of the top surfaces of the dielectric layer 114, as shown in FIG. 4.

Figure 4:
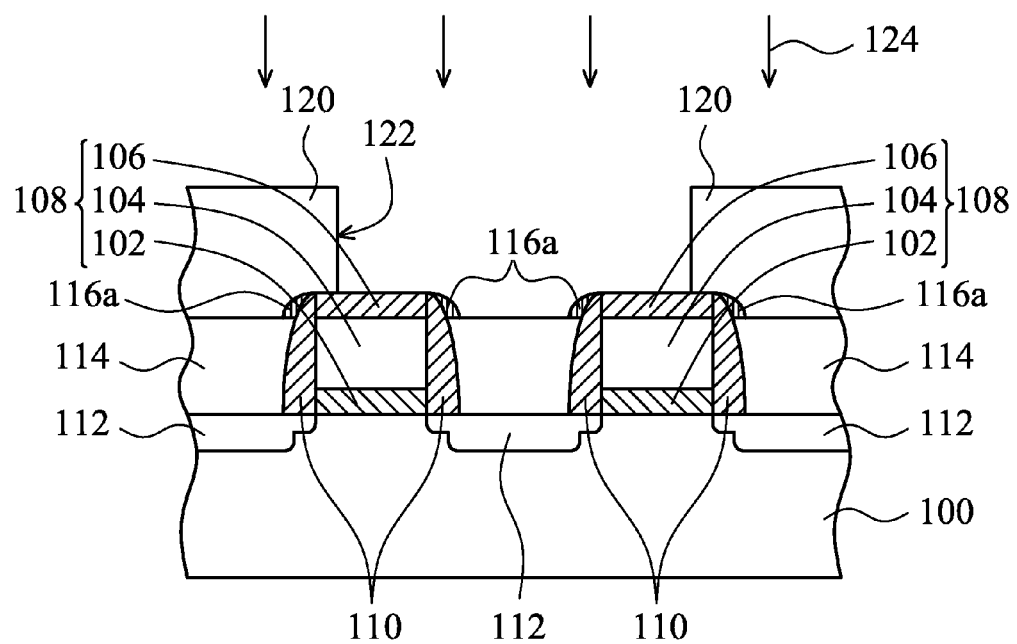

In FIG. 4, a patterned mask layer 120 with an opening 122 therein is provided over the substrate 100, partially covering the transistors T and the dielectric layer 114. The opening 122 partially exposes a region between the two transistors T and the dielectric layer 114 therein. In this embodiment, a protection barrier 116a adjacent to an insulating spacer 110 of each of the transistors T is exposed. Next, an etching process 124, for example a dry etching process, is performed, using the patterning mask layer 120 as an etching mask, to entirely remove the dielectric layer 114 exposed by the opening 122. In one embodiment, the etching process 124 comprises an over-etching step to ensure that the dielectric layer 124 exposed by the opening 122 is entirely removed and the source/drain region 114 thereunder is exposed. The patterned mask layer 120 may comprise materials such as photoresists.

Figure 5:
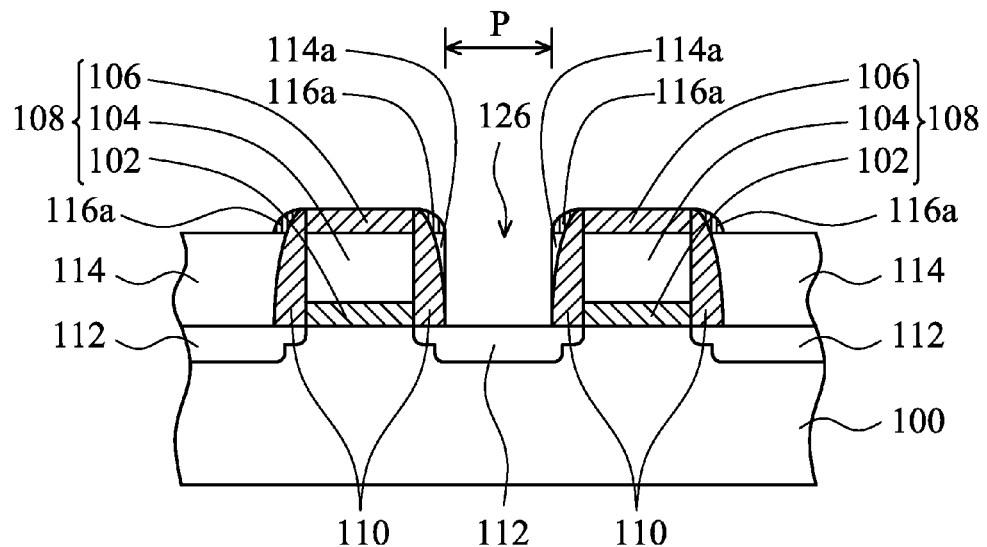

In FIG. 5, after the etching process 124, the patterned mask layer 120 is removed and a self-aligned contact opening 126 is thus left between the two transistors T, and the self-aligned contact opening 126 exposes a source/drain region 112 shared by the two transistors T. In this embodiment, due to the protection barrier 116a formed on the top corner of the insulating spacer 110 adjacent to the self-aligned contact opening 126, a dielectric spacer 114a made the portion of the dielectric layer 114 is formed under the protection barrier 116a due to masking of the protection barrier 116a during the etching process 124, as shown in FIG. 4. In addition, during formation of the self-aligned contact opening 126, the insulating spacer 110 of the two transistors T are passivated by the dielectric spacer 114a and the protection barrier 116a and is not etched during formation of the self-aligned contact opening 126. Thus, the insulating spacer 110 of the two transistors T exposed by the self-aligned contact opening 126 are not etched during formation of the self-aligned contact opening 126 due to passivation of the dielectric spacer 114a and the protection barrier 116a and a pitch P between the two transistors T is further decreased and shorts between a sequentially formed self-aligned contact and the transistors T are prevented.

Figure 6:
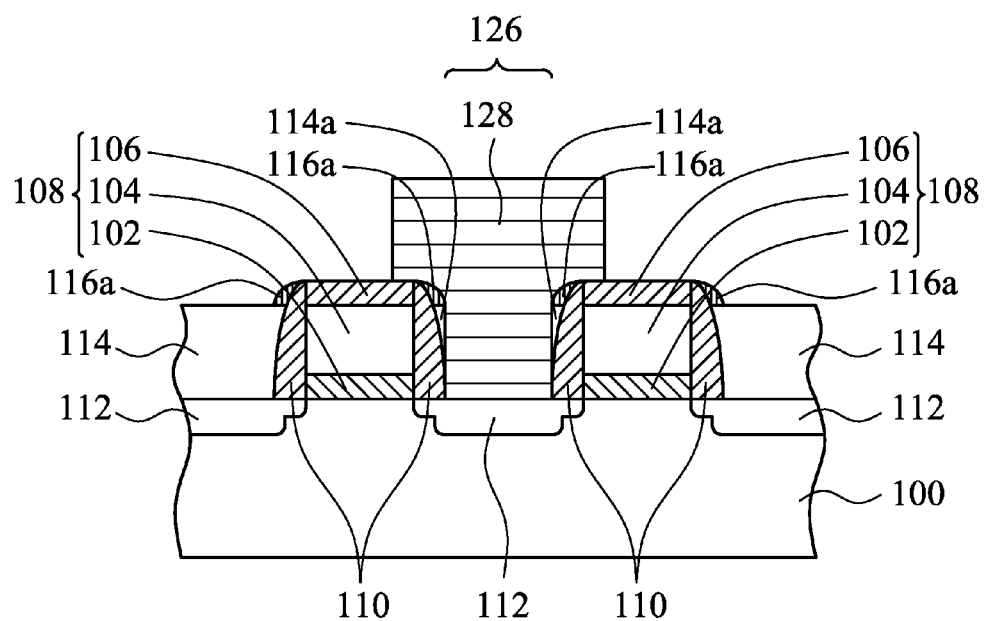

In FIG. 6, a layer of conductive material (not shown) such as aluminum is blanketly formed over the substrate 100, covering the dielectric layers 114, the dielectric spacer 114a, the transistors T, and the protection barriers 116a to fill the self-aligned contact opening 126. Next, the layer of conductive material is patterned to form a conductive layer 128 partially covering the transistors T adjacent the self-aligned contact opening 126 and fills the contact opening 126 (see FIG. 5) as a self-aligned contact contacting the source/drain region 112 of the transistors T.

As shown in FIG. 6, an exemplary integrated circuit with a self-aligned conductive contact is provided, comprising:

A substrate (e.g. the substrate 100) has a transistor (e.g. one of the transistors T) formed thereover, wherein the transistor comprises a mask layer (e.g. the mask layer 106) and a pair of insulating spacers (e.g. the insulating spaces 110) formed on opposite sides of the mask layer; a dielectric spacer (e.g. the dielectric spacer 114a) partially covering at least one of the insulating spacers of the transistor; a protection barrier (e.g. the protection barrier 116a) over the dielectric spacer; and a conductive layer (e.g. the conductive layer 128) formed over the mask layer, the protection barrier, the dielectric spacer, the insulating spacer and the dielectric spacer as a self-aligned contact for contacting a source/drain region of the transistor.

Figure 7:
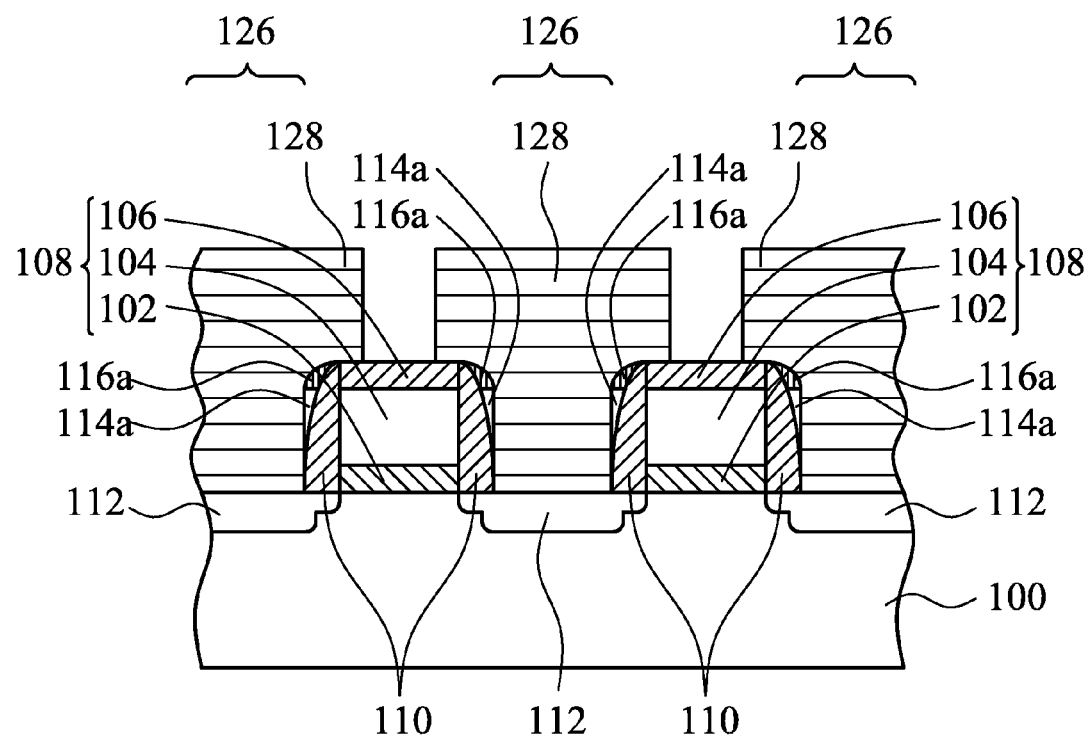
FIG. 7 is a cross section showing an integrated circuit with a plurality of self-aligned contacts according to an embodiment of the invention.

FIG. 7 is a cross section showing an exemplary integrated circuit with a plurality of self-aligned conductive contacts formed in an integrated circuit.

As shown in FIG. 7, a plurality of self-aligned contacts 128 similar with the self-aligned contact 128 illustrated in FIG. 6 are formed over the substrate 100 and each of the self-aligned contacts 128 is located over one of the source/drain regions 112 and in physical contact thereof. Fabrication of the self-aligned contacts 128 are similar with that disclosed in FIGS. 1-6 and a plurality of self-aligned contact openings 126 are formed by removing the dielectric layer 114 at the same time for exposing each of the source/drain regions 112 and a self-aligned contact 128 can be formed in each of the self-aligned contact openings 126 according to the process described above in FIGS. 6-7. In this embodiment, the protection barrier 116a and the dielectric spacer 114a are left and adjacent to both sides of the transistor T, and both of the insulation spacers 110 exposed by the self-aligned contact openings 126 are properly passivated by the protection barrier 116a and the dielectric spacer 114a, thus a pitch of the adjacent transistors T can be further reduced and shorts between the self-aligned contact 128 and the transistors T are prevented.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a self-aligned contact, comprising:
   providing a substrate with a transistor thereover, wherein the transistor comprises a mask layer and a pair of insulating spacers formed on opposite sides of the mask layer;
   forming a dielectric layer over the substrate to cover the transistor;
   partially removing the dielectric layer to expose a top portion of the transistor;
   conformally forming a barrier layer over the dielectric layer and the top portion of the transistor;
   etching the barrier layer and leaving a protection barrier over a top corner of the insulating spacers of the transistor;
   performing an etching process to entirely remove exposed portions of the dielectric layer using the protection barrier and the mask layer as an etching mask, thereby forming a self-aligned contact opening exposing a source/drain region of the transistor and leaving a remainder of the dielectric layer as a dielectric spacer covered by the protection barrier; and forming a conductive layer in the self-aligned contact opening to contact the source/drain region of the transistor.

2. The method as claimed in claim 1, wherein the mask layer and the insulating spacers comprise silicon nitrides.

3. The method as claimed in claim 1, wherein the barrier layer comprises silicon nitride or silicon oxynitride.

4. The method as claimed in claim 1, wherein the dielectric layer comprises $SiO_2$, BPSG or spin-on dielectrics.

5. The method as claimed in claim 1, wherein the barrier layer has a thickness of about 2-10 nm.

6. The method as claimed in claim 1, wherein the etching process comprises an over-etching step.

7. The method as claimed in claim 1, wherein the conductive layer comprises aluminum.

8. An integrated circuit with a self-aligned contact, comprising:
 a substrate with a transistor formed thereover, wherein the transistor comprises a mask layer and a pair of insulating spacers formed on opposite sides of the mask layer;
 a dielectric spacer partially covering at least one of the insulating spacers of the transistor, wherein the dielectric spacer comprises $SiO_2$, BPSG or spin-on dielectrics;
 a protection barrier over the dielectric spacer; and
 a conductive layer formed over the mask layer, the protection barrier, the dielectric spacer, the insulating spacer and the dielectric spacer as a self-aligned contact for contacting a source/drain region of the transistor.

9. The integrated circuit as claimed in claim 8, wherein the mask layer and the insulating spacers comprise silicon nitrides.

10. The integrated circuit as claimed in claim 8, wherein the protection barrier comprises silicon nitride or silicon oxynitride.

11. The integrated circuit as claimed in claim 8, wherein the conductive layer comprises aluminum.

12. The integrated circuit as claimed in claim 8, further comprising another dielectric spacer formed over the substrate, partially covering the other insulating spacer.

13. The integrated circuit as claimed in claim 8, further comprising another protection barrier formed on the dielectric spacer partially covering the other insulating spacer.

* * * * *